US005440282A

United States Patent [19]

Devendorf et al.

[11] Patent Number: 5,440,282

[45] Date of Patent: Aug. 8, 1995

[54] FILTER STRUCTURE WITH ANTI-ROTATION KEYING

[75] Inventors: Alan E. Devendorf, Baldwinsville; Jerry Gould, Liverpool, both of N.Y.

[73] Assignee: Eagle Comtronics, Inc., Syracuse, N.Y.

[21] Appl. No.: 205,406

[22] Filed: Mar. 3, 1994

[51] Int. Cl.[6] .................... H03H 7/01; H01R 13/66

[52] U.S. Cl. .................... 333/185; 333/176; 439/578; 439/620

[58] Field of Search .................... 333/12, 181–183, 333/, 185; 439/607–610, 620, 578–585

[56] References Cited

U.S. PATENT DOCUMENTS

| | | | |
|---|---|---|---|
| 4,273,407 | 6/1981 | Snuffer et al. | 439/579 |
| 4,346,958 | 8/1982 | Blanchard | 439/584 |
| 4,451,803 | 5/1984 | Holdsworth et al. | 333/12 |
| 4,797,120 | 1/1989 | Ulery | 439/578 |
| 5,044,989 | 9/1991 | Aliquot et al. | 439/578 |
| 5,150,087 | 9/1992 | Yoshie et al. | 333/185 |
| 5,295,864 | 3/1994 | Birch et al. | 439/578 |
| 5,340,944 | 8/1994 | Wang | 333/185 X |

*Primary Examiner*—Seungsook Ham

*Attorney, Agent, or Firm*—Parkhurst, Wendel & Rossi

[57] ABSTRACT

A filter structure of inexpensive design that reliably prevents rotation of a filter housing with respect to an outer sleeve of the filter structure is disclosed. More specifically, a connector portion of an end cap of the filter structure is keyed with an opening provided in a receiving end of the outer sleeve to prevent rotation of the filter housing with respect to the outer sleeve. Keying is preferably accomplished by forming the connector portion of the end cap in the shape of a "Double-D", although other shapes may be readily employed.

5 Claims, 4 Drawing Sheets

FILTER STRUCTURE WITH ANTI-ROTATION KEYING

FIELD OF THE INVENTION

The invention relates to electrical filters that are used to decode or unscramble protected television signals in order to permit their reception. More specifically, the invention relates to an improved filter structure that prevents a filter housing from rotating with respect to an outer sleeve when a failure occurs in the mechanism used to secure the filter housing to the outer sleeve.

BACKGROUND

Tuned filters have been employed for a number of years to decode scrambled or protected television signals. U.S. Pat. No. 4,451,803 discloses a notch filter, for example, that includes two separate electrically interconnected filter sections mounted on a common circuit board. The two filter sections are magnetically isolated through an isolation area defined by an isolation shield. The common circuit board is placed within a filter housing having one open end and an integral connector located at the other end. An end cap is then attached to the open end of the filter housing with a press fit. The filter housing with attached end cap is then located within an outer sleeve by sliding the filter housing into an open end of the outer sleeve. A press-fit is commonly used as the securing mechanism to retain the filter housing within the outer sleeve housing.

A potential problem has been identified with regard to the conventional filter structures that utilize a press-fit to retain the filter housing within the outer sleeve, namely, the press-fit has occasionally failed, thereby allowing the filter housing to freely rotate within the outer sleeve. The failure of the press-fit may result from tolerance build-up, natural variations in the hardness of the outer sleeve or processing variations in the manufacturing process. Regardless of the cause, the spinning or rotation of the filter housing with respect to the outer sleeve has caused concerns among users of the filters over possible poor sealing of the filter structure against moisture and possible problems related to RFI emissions or leakage. In view of the above, it would be desirable to provide a filter structure of inexpensive design that would reliably prevent rotation of the filter housing with respect to the outer sleeve in the event of failure of the securing mechanism.

SUMMARY OF THE INVENTION

The invention provides a filter structure of inexpensive design that reliably prevents rotation of a filter housing with respect to an outer sleeve of the filter structure. More specifically, the filter structure includes a circuit board assembly located within a filter housing, an end cap attached to one end of the filter housing, and an outer sleeve including an open end and a receiving end. The filter housing is located within the outer sleeve such that a connector portion of the end cap passes through an opening in the receiving end of the outer sleeve. The connector portion includes a base portion that keyed with the opening in the receiving end of the outer sleeve to prevent rotation of the filter housing with respect to the outer sleeve.

BRIEF DESCRIPTION OF THE DRAWINGS

The invention will be described in greater detail with reference to the accompanying drawings, wherein.

DETAILED DESCRIPTION OF THE PREFERRED EMBODIMENT

A conventional filter structure, and the problem associated therewith, will be discussed prior to a detailed description of a preferred embodiment of the invention.

Figure 1:
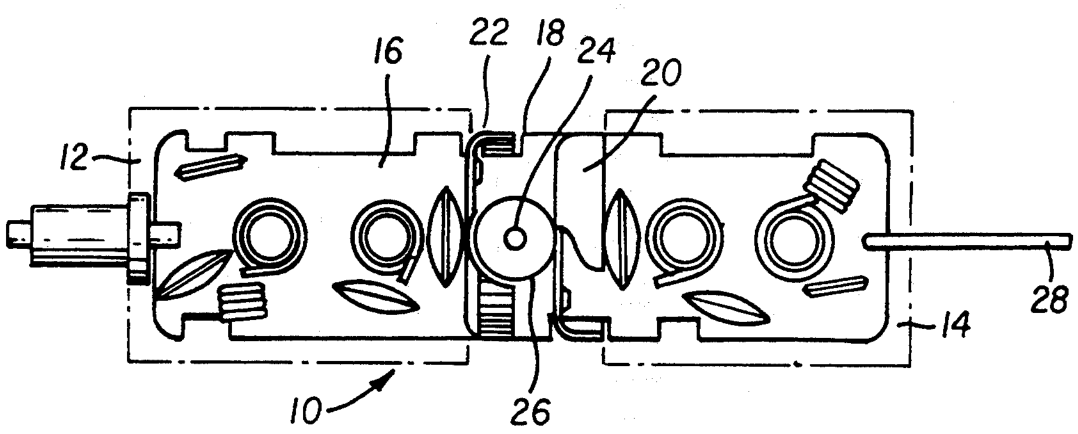
FIG. 1 (prior art)
FIG. 1 is a top view of a conventional filter circuit board assembly.

A top view of a conventional notch filter circuit board assembly is illustrated in FIG. 1. The circuit board assembly 10 includes first and second filter sections 12, 14 commonly provided on a single circuit board 16. If desired, separate circuit boards can also be employed in place of a common circuit board. The first and second filter sections 12, 14 are separated by an isolation area 18, which is defined by two isolation shields 20, 22 (shown partially cut away) that project both above and below the upper and lower surface of the circuit board 10. A conductor within the isolation area 18 (not shown), which interconnects the first and second filter sections 12, 14, runs along part of its course substantially parallel to and midway between the isolation shields 20, 22. A test point 24 is connected to the conductor to project upwardly from the component mounting surface of the circuit board 16 and between the isolation shields 20, 22. A sleeve 26, also located between the isolation shields 20, 22, prevents the test point 24 from contacting electrical ground. The isolation shields 20, 22 are connected to electrical ground, and serve to provide magnetic isolation between the first and second filter sections 12, 14 by preventing any magnetic fields from one filter section from affecting the other filter section. A more detailed explanation of the illustrated circuit board assembly is provided in U.S. Pat. No. 4,451,803, the contents of which are herein incorporated by reference.

Figure 2:
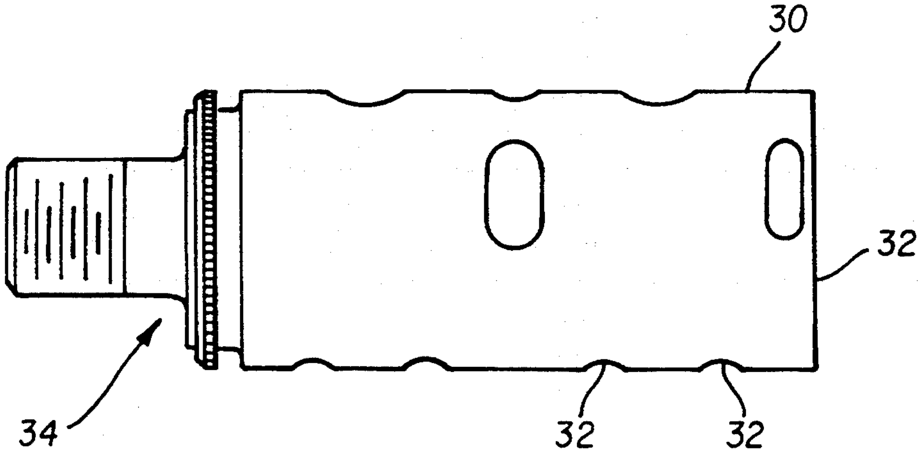
FIG. 2 (prior art)
FIG. 2 illustrates a conventional filter housing.

The circuit board assembly 10 is incorporated within a cylindrical or tube-like filter housing 30 of the type illustrated in FIG. 2. The filter housing 30 preferably includes holes 32, which allow access to tuning slugs within the various inductor coils employed in the circuit board assembly 10, a first open end 32, and a second end having an integral threaded connector 34. The open end 32 of the filter housing 30 is closed by an end cap that is press-fit therein once the circuit board assembly 10 has been placed within the filter housing 30. Specifically, the outer periphery of the end cap is press-fit within the inner periphery of the filter housing 30.

Figure 3:
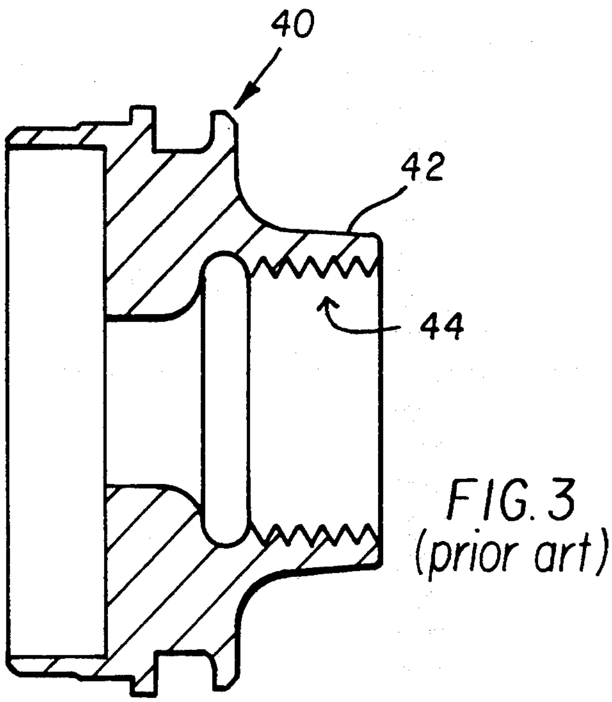
FIG. 3 (prior art)
FIG. 3 is a sectional side view of a conventional end cap.

FIG. 3 illustrates a sectional side view of a conventional end cap 40 which includes a connector portion 42 having an internal screw threaded bore 44 for connection with an external cable or directional tap port. An input terminal 28 of the circuit board assembly 10 (See FIG. 1) passes through the threaded bore 44 when the end cap 40 is press-fit into the open end of the filter housing 30. The outside surface of the connector portion 42 is circular.

Figure 5:
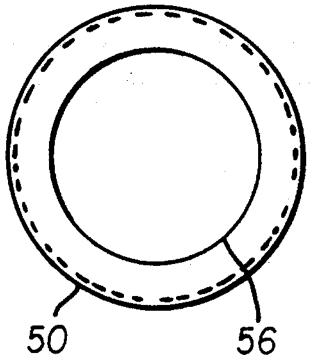
FIG. 5 (prior art)
FIG. 5 is a front view of the outer sleeve shown in FIG. 4 illustrating the circular retainer opening.
Figure 4:
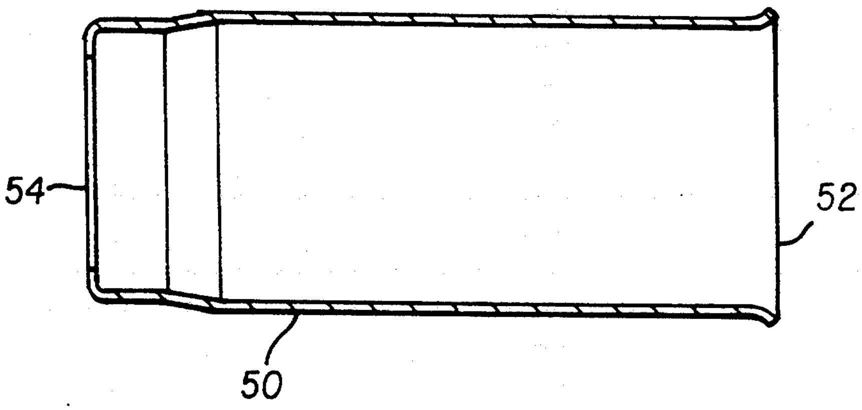
FIG. 4 (prior art)
FIG. 4 is a sectional side view of a conventional outer sleeve with a circular retainer opening.

The combined filter housing 30 and conventional end cap 40 are placed within an outer sleeve 50 of the type shown in cross-section in FIG. 4. A first end 52 of the outer sleeve 50 is completely open to allow the combined filter housing 30 and end cap 40 to slide therein. A second retaining end 54 of the outer sleeve 50, however, has a retainer opening 56 through which only the connector portion 42 of the end cap 40 can pass. As shown in FIG. 5, the retainer opening 56 is circular in shape to match the circular shape of the connector portion 42 of end cap 40. A press-fit operation is applied to the retaining end 54 of the outer sleeve 50 to press-fit the filter housing 30 to the outer sleeve 50, and a crimping operation is applied to the open end 52 of the outer sleeve 50 to capture or enclosed the integral threaded connector 34 portion of the filter housing 30. As was mentioned above, however, the press fit may fail at some point, thereby allowing the filter housing 30 and end cap 40 to freely rotate with respect to the outer sleeve 50.

Figure 6:
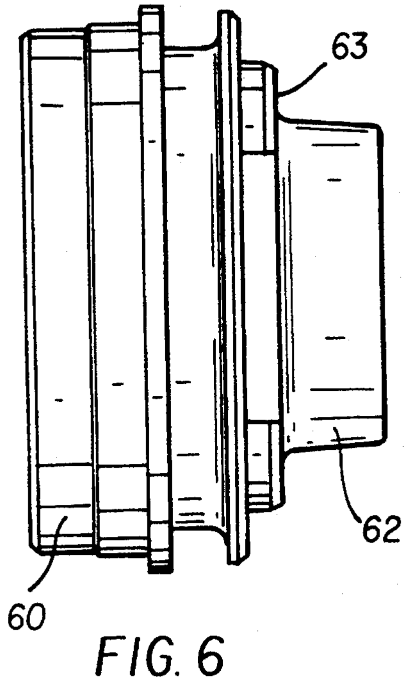
FIG. 6 is a side view of an end cap in accordance with the invention.
Figure 7:
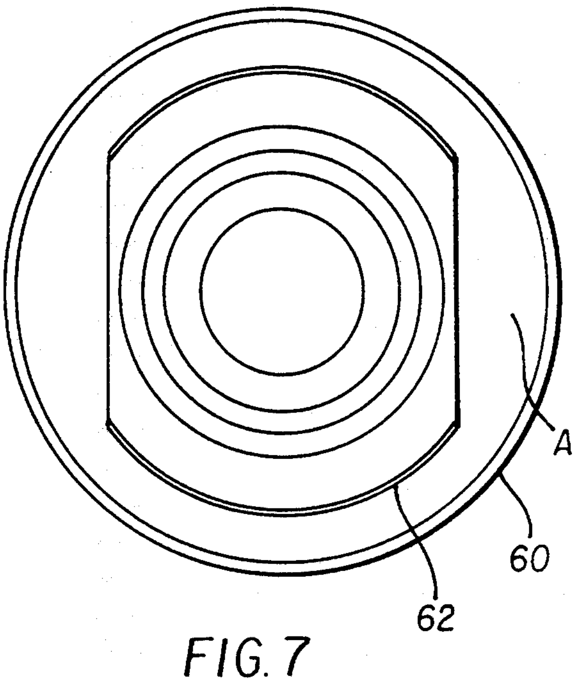
FIG. 7 is a front view of the end cap shown in FIG. 6.
Figure 8:
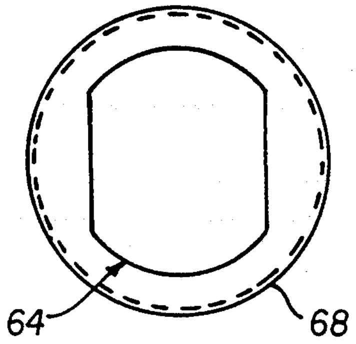
FIG. 8 is a front view of an outer sleeve in accordance with the invention.
Figure 9:
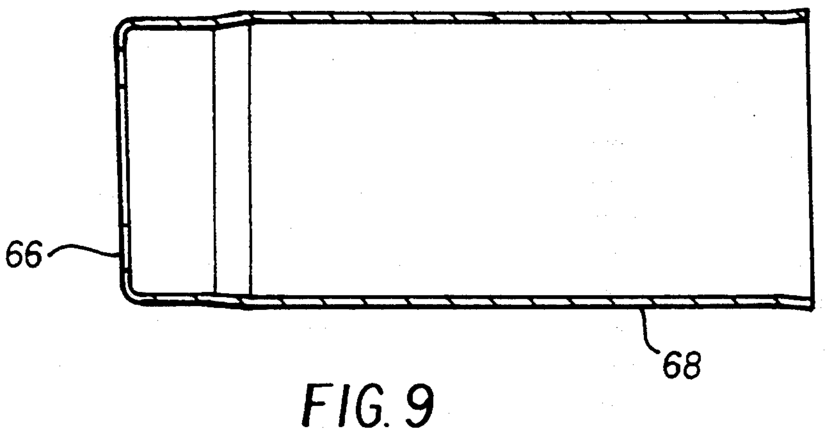
FIG. 9 is a sectional side view of the outer sleeve illustrated in FIG. 8.
Figure 10:
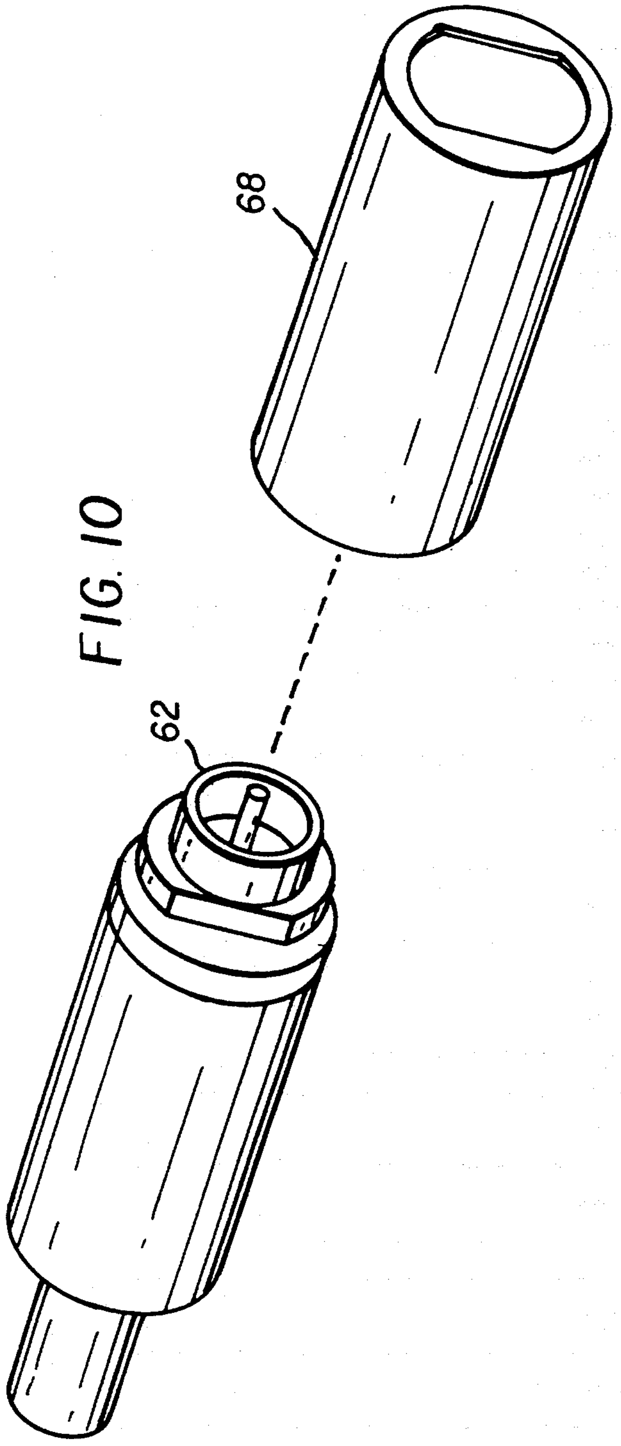
FIG. 10 is a perspective view of a combined filter housing and end cap oriented for insertion into the outer sleeve shown in FIG. 8.
Figure 11:
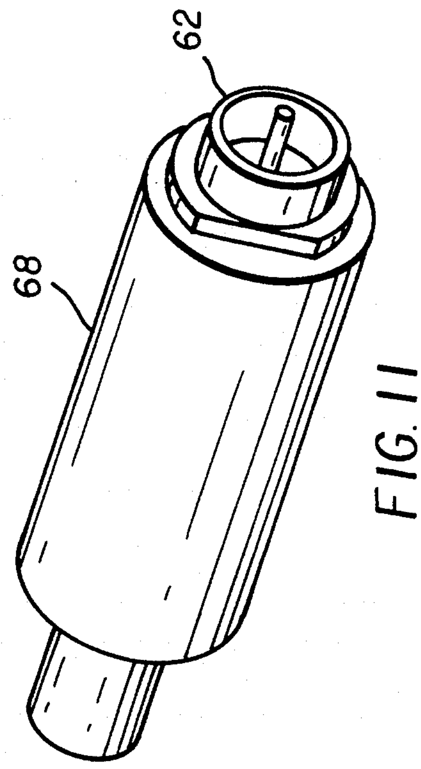
FIG. 11 is a perspective view of a combined filter structure in accordance with the invention.

In order to overcome the rotation problem associated with the conventional end cap and outer sleeve designs illustrated in FIGS. 3–5, the invention utilizes an end cap having an anti-rotation locking key feature. More specifically, the shape of a connector portion of the end cap and the receiving opening in the receiving end of an outer sleeve through which the connector portion passes are keyed such that the filter housing and end cap cannot rotate in the event of a failure of the press fit. In a preferred embodiment illustrated in FIGS. 6 and 7, a connector portion 62 of the end cap 60 includes a base portion 63 that is formed in a "Double-D" configuration, so named as the shape is reminiscent of back to back uppercase Ds with respect to line A passing through the center of the connector portion 62. A retainer opening 64 in a retaining end 66 of an outer sleeve 68 is matched to the Double-D shape of the base portion 63 of the connector portion 62 as shown in FIGS. 8 and 9. The end cap 60 is press-fit into the open end of the filter housing 30 in the same manner as the conventional end cap 40, and the combined filter housing 30 and end cap 60 is inserted into the outer sleeve 68 and fixed in the same manner as the conventional outer sleeve 50 as shown in FIGS. 10 and 11. The non-circular shape of the connector portion 62 and retainer opening 64 prevents rotation of the filter housing 30 within the outer sleeve 68 in the event of failure of the press-fit (or other securing mechanism) between the filter housing 30 and outer sleeve 68.

The invention has been described with reference to a preferred embodiment thereof. It will be understood, however, that modifications and variations are possible within the scope of the appended claims. For example, the connector portion of the end cap can be manufactured in any desired geometric shape, including a star, a rectangle, a square, an oval, etc., as long as the rotation of the filter housing and end cap with respect to the outer sleeve is prevented. Further, the connector portion can be made circular and a separate keying element provided if so desired. For example, a keying pin, extending adjacent to the connector portion from the surface of the end cap, that fits into a keying hole provided in the outer sleeve may also be utilized. The invention may also be utilized in a filter structure in which the connector is not formed integral with the filter housing, but instead, is provided on a separate end cap attached to the filter housing. The invention is also not limited to the use of press-fitting to secure the end cap to the filter housing or the outer sleeve to the filter housing, but can be utilized with filter structures employing any type of securing mechanism. Finally, the invention is not specifically limited to decoding filters used in television applications, but can be utilized with any type of electrical filter in any desired application.

What is claimed is:

1. A coaxial filter structure comprising:

a circuit board assembly having a terminal extending therefrom, said circuit board assembly including filtering means and being located within a cylindrical filter housing;

an end cap including a connector portion which is coaxial with said terminal, said end cap being attached to one end of the filter housing;

a cylindrical outer sleeve including an open end and a receiving end, wherein the filter housing is located within the outer sleeve such that the connector portion of the end cap passes through an opening in the receiving end of the outer sleeve; and anti-rotation means for preventing said outer sleeve from rotating with respect to said filter housing, said anti-rotation means comprising a base portion of said connector portion which is keyed to and rotatably locks against an inner periphery of the opening in the receiving end of the outer sleeve.

2. A filter structure as set forth in claim 1, wherein the base portion is non-circular.

3. A filter structure as set forth in claim 1, wherein the base portion is formed in the shape of a Double-D.

4. A filter structure as set forth in claim 1, wherein the circuit board assembly includes a first filter section separated from a second filter section by an isolation section.

5. A coaxial filter structure comprising:

a circuit board assembly having a terminal extending therefrom and including a filtering means;

a cylindrical filter housing, wherein the circuit board assembly is located within the filter housing;

an end cap including a connector portion which is coaxial with said terminal, wherein the end cap is attached to an end of the filter housing;

a cylindrical outer sleeve including an open end and a receiving end, wherein the filter housing, with the circuit board assembly located therein and the end cap attached thereto, is located within the outer sleeve, such that the connector portion of the end cap passes through an opening in the receiving end and is retained within the outer sleeve via a securing mechanism; and anti-rotation means for preventing the filter housing from rotating within the outer sleeve, said anti-rotation means comprising a base portion which is keyed to and rotatably locks against an inner periphery of the opening in the receiving end of the outer sleeve.

* * * * *